US005793217A

United States Patent [19]

Herbst, Jr.

[11] Patent Number: 5,793,217

[45] Date of Patent: *Aug. 11, 1998

[54] DIFFERENTIAL CAPACITANCE SENSOR DIODE CIRCUIT

[75] Inventor: Raymond W. Herbst, Jr., St. Paul, Minn.

[73] Assignee: Automated Quality Technologies, Inc., St. Paul, Minn.

[ * ] Notice: The term of this patent shall not extend beyond the expiration date of Pat. No. 5,650,730.

[21] Appl. No.: 825,367

[22] Filed: Mar. 28, 1997

Related U.S. Application Data

[62] Division of Ser. No. 436,171, May 9, 1995, Pat. No. 5,650,730.

[51] Int. Cl.[6] ........ G01R 27/26

[52] U.S. Cl. ........ 324/690; 324/663; 324/678; 324/688

[58] Field of Search ........ 324/663, 666, 324/669, 671, 672, 678, 680, 686, 688, 690; 340/572

[56] References Cited

U.S. PATENT DOCUMENTS

| | | | |
|---|---|---|---|
| 3,323,699 | 6/1967 | Bricker, Jr. | 226/15 |
| 3,341,774 | 9/1967 | Dyben | 324/663 |
| 3,519,922 | 7/1970 | Nash et al. | 324/671 |
| 4,276,547 | 6/1981 | Bowen et al. | 340/675 |
| 4,287,471 | 9/1981 | Ko et al. | 324/678 |
| 4,881,025 | 11/1989 | Gregory | 324/672 |
| 4,952,882 | 8/1990 | Mayer et al. | 324/671 |
| 5,076,566 | 12/1991 | Kriegel | 340/675 |
| 5,133,396 | 7/1992 | Selak et al. | 156/361 |
| 5,138,268 | 8/1992 | Mulkey et al. | 324/671 |
| 5,232,540 | 8/1993 | Southwell et al. | 156/361 |

FOREIGN PATENT DOCUMENTS

| | | |
|---|---|---|
| 0289212A1 | 11/1988 | European Pat. Off. . |
| 2115553 | 9/1983 | United Kingdom . |

*Primary Examiner*—Ernest F. Karlsen
*Assistant Examiner*—Diep Do
*Attorney, Agent, or Firm*—Kinney & Lange, P.A.

[57] ABSTRACT

A capacitance sensor assembly for use with a label detection and registration system for detecting a lateral edge of a label on a web bearing a plurality of such labels and moving in a longitudinal direction through a capacitance gap in the sensor assembly. The capacitance sensor assembly includes a reference plate electrode, and a pair of sensor electrodes extending substantially parallel to and spaced apart from the reference plate electrode to form the capacitance gap. The pair of sensor electrodes has a differential capacitance, when the web bearing the plurality of labels thereon is in the capacitance gap, which is used to provide a signal indicative of the lateral edge of the label.

19 Claims, 6 Drawing Sheets

DIFFERENTIAL CAPACITANCE SENSOR DIODE CIRCUIT

This is a division of application Ser. No. 08/436,171, filed May 9, 1995, now U.S. Pat. No. 5,650,730.

BACKGROUND OF THE INVENTION

The present invention relates generally to a label detection and registration system for determining the position or dimension of a label or for counting labels carried on a web material bearing a plurality of such labels, and more particularly, to a label detection and registration or counting system having a capacitance sensor probe assembly.

Label detection and registration systems are used on bottling or packaging lines to insure accurate and repeated registration or placement of a label on a bottle or on other packages. Accuracy of label placement is crucial to maintain a consumer perception of product quality.

Optical techniques using photo-electric sensors have traditionally been used to detect labels carried on a release liner or web backing material. These optical sensors work well for the standard label construction having a web of one color and a label of another color. However, optical sensors have limitations when detecting labels which do not contrast with the backing material (web) and which are constructed of a non-reflective material. These limitations cause errors and sometimes complete failure when detecting a clear or transparent label affixed to a clear or transparent web, or when detecting a label of the same color as the web material. Since there is a significant trend today toward using transparent webs and labels, the attempts to overcome the optical limitation have involved printing registration lines on the clear labels and/or along the entire web. These attempts are costly, inconvenient and aesthetically undesirable.

Other methods of label detection involve mechanical switch methods, but these methods may be unreliable and can damage the label stock.

Capacitive sensors have also been used for label detection by measuring the difference in the dielectric material of the web material alone and the combined web and label material between two parallel electrode plates. The change in capacitance provides an indication of the leading and trailing edges of the label. The capacitive approach is superior to the optical detection techniques because of its substantial independence of the web and label material type, color and opacity. For parallel plate capacitors, the capacitance between the plates is determined using the following equation:

$$C=\epsilon_o\epsilon_r\frac{S}{l}$$

where "C" is the capacitance; "$\epsilon_o$" is the permittivity of a vacuum; "$\epsilon_r$" is the permittivity of material between the parallel plates; "S" is the surface area of the plates, and "l" is the distance between the plates.

Capacitance sensors for label registration and detection are known. These known sensors were usually circular, or, if elongated in shape, were too small to be effective and accurate in the label detection environment (e.g., less than a half inch in any dimension). The small size and circular shape of the early sensors resulted in the sensors being insensitive to the edge of the label material and thus caused misalignment of the label. The small surface area "S" also required the air gap distance "l" between the sensor electrode and the opposing metal surface to be very small which often caused the labels to jam under the sensor.

Rectangular sensors have also been used for label detection and registration. More particularly, a single elongated rectangular sensor including a capacitance shield around an active sensing tip is known in the art. However, there is a continuing need for an improved capacitance sensor for use in label detection or in other detection schemes.

SUMMARY OF THE INVENTION

The present invention provides a capacitance sensor assembly for use with a label detection and registration system for detecting a lateral edge of a label on a web bearing a plurality of such labels and moving in a longitudinal direction through a capacitance gap in the sensor assembly. The capacitance sensor assembly includes a reference plate electrode, and a pair of sensor electrodes extending substantially parallel to and spaced apart from the reference plate electrode to form the capacitance gap. The pair of sensor electrodes has a differential capacitance, when the web bearing the plurality of labels thereon is in the capacitance gap, which is used to provide a signal indicative of the lateral edge of the label.

Another aspect of the present invention is a capacitance sensor which provides an output signal indicative of a lateral edge of a label wherein the output signal has a sequence of triangular peaks, each peak being indicative of a lateral edge of the label. In this arrangement, the output signal is divided into a first signal indicative of a leading edge of the label and a second signal indicative of a trailing edge of the label. A flip flop operable with the first and second signals converts the first and second signals into a square wave output signal representative of the leading and trailing edges of the label.

Another aspect of the present invention is to provide a sensor assembly for use with a label detection and registration system for detecting a lateral edge of a label on a web bearing a plurality of such labels and moving in a longitudinal direction past the sensor assembly. However, in this arrangement the sensor assembly includes a sensor housing, and both a capacitance sensor and an optical sensor positioned within the sensor housing. The capacitance sensor includes a reference plate electrode and a sensor electrode which extends substantially parallel to and spaced apart from the reference plate electrode. The sensor electrode detects a change in capacitance between the label and the web to provide a first signal indicative of the lateral edge of the label. The optical sensor provides a second signal indicative of the lateral edge of the label. A switch mechanism is used for selecting either the first signal of the capacitance sensor or the second signal of the optical sensor as an output.

Another aspect of the present provides a capacitance sensor wherein the label detection circuitry is mounted within a cavity of a sensor housing, in addition to the actual capacitance sensor, for receiving the first signal and constructing an output squarewave signal indicative of leading and trailing lateral edges of the label. The sensor housing also includes a plurality of LED indicators for adjusting various features of the label detection circuitry. This arrangement eliminates the need for external units containing the label detection circuity and provides a more efficient and compact label detector.

DETAILED DESCRIPTION OF THE PREFERRED EMBODIMENTS

General Description

Figure 1:
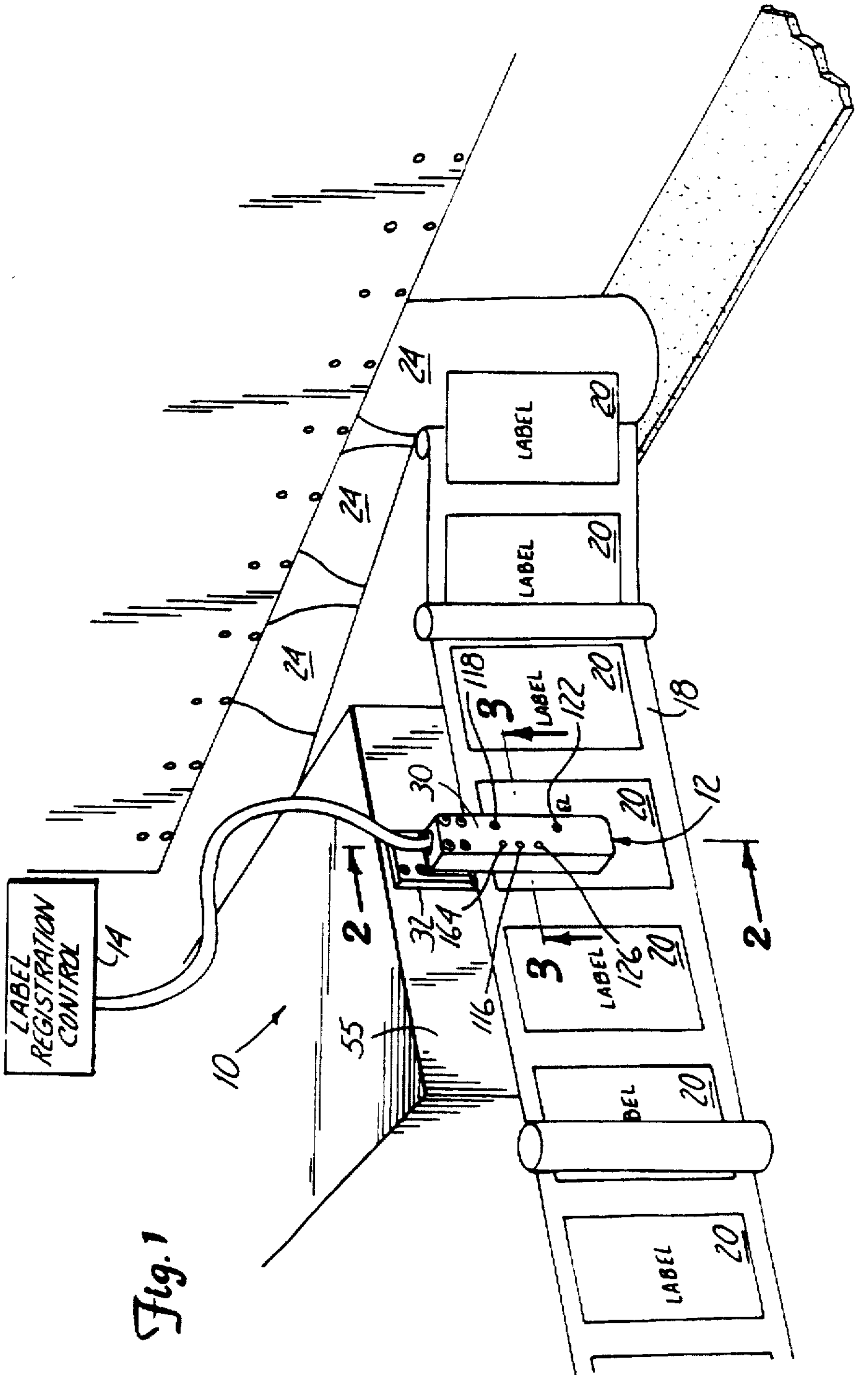
FIG. 1 is a perspective view of a label registration and detection system of the present invention.

As shown in FIG. 1, a label detection and registration system according to the teachings of the present invention is illustrated generally at 10. The system 10 includes a label detector assembly 12 connected to a control module of the label registration control 14. The label detector assembly 12 includes a capacitance sensor unit 13 and an optical sensor unit 150 (see FIG. 5).

The Capacitance Sensor Unit

The capacitance sensor unit 13 senses capacitance as a function of the amount of dielectric material in a gap 16 between parallel plates in the capacitance sensor unit 13. A web material 18 bearing a plurality of labels (each of which is denoted by reference numeral 20) is moved in a longitudinal direction through the gap 16 so that there is a first dielectric constant when the web material 18 alone is in the gap 16 and so that there is a second dielectric constant when both the web material 18 and the label 20 are in the gap 16. Changes in the dielectric constant and thus changes in the capacitance cause changes in current. Circuity in the capacitance sensor unit 13 detects these current changes and thereby detects the lateral edges of labels 20 on the web material 18 for registering the labels 20 with containers 24 or other objects to which the labels 20 are affixed. The containers 24 are shown in FIG. 1 moving along a labelling line where the labels 20 are being applied at a rate of approximately 5–10 labels per second.

Figure 2:
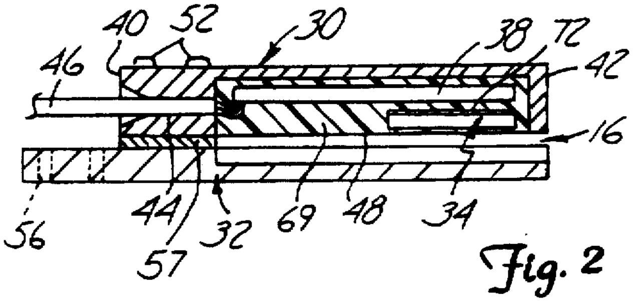
FIG. 2 is a sectional view of the probe assembly taken generally along line 2—2 of FIG. 1.
Figure 4:
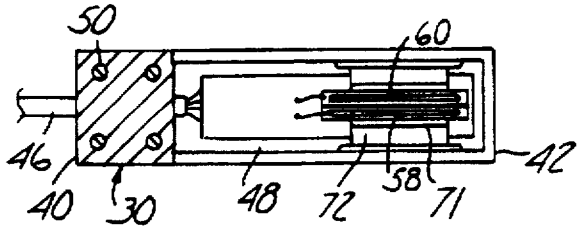
FIG. 4 is a bottom plan view of the sensor electrodes of the present invention taken generally along line 4—4 of FIG. 3.
Figure 3:
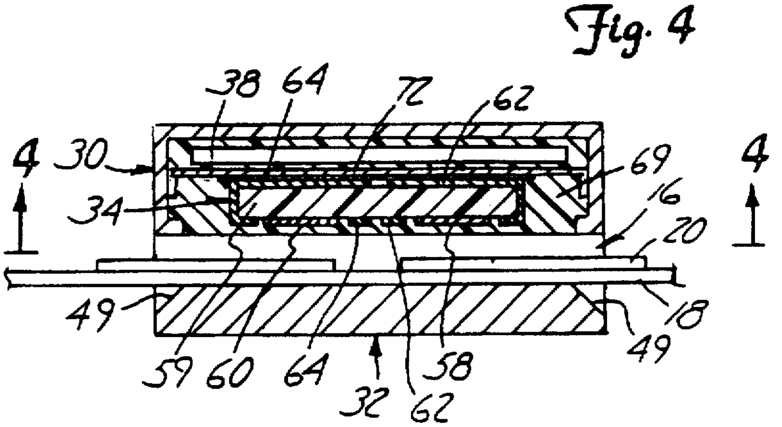
FIG. 3 is a sectional view of the probe assembly taken generally along line 3—3 of FIG. 1.

As shown in FIGS. 2–4, the detection assembly 12 includes a sensor housing 30, a reference plate electrode 32, a sensor electrode unit 34, and edge detection circuitry 38.

Sensor Housing

The sensor housing 30 has an inner end 40, an outer end 42, a first cavity 44 at the inner end 40 thereof for receiving a shielded cable 46 connecting the detection assembly 12 to the registration machinery 14, and a second cavity 48 for mounting the pair of sensor electrodes 58 and 60 and the edge detection circuitry 38. The sensor housing 30 is generally rectangular and is comprised of a metallic material which is cast or machined to form the first and second cavities 44 and 48 therein. The dimensions of the sensor housing 30 are approximately 4.5 inches in length, 1.25 inches in width, and 0.56 inches in height. The sensor housing 30 includes a plurality of threaded holes 50 at the inner end thereof. A mounting mechanism 52 such as screws or bolts are operable with the holes 50 for adjustably mounting the sensor housing 30 to the reference plate electrode 32. The mounting mechanism 52 must provide a secure orientation of the sensor housing 30 with respect to the reference plate electrode 32 to prevent undesired changes in the gap 16 which might effect capacitance measurements.

Reference Plate Electrode

As shown in FIGS. 2 and 3, the reference plate electrode 32 is comprised of a metallic material and integrally mounted to the inner end 40 of the sensor housing 30 by mounting screws 52. The reference plate electrode 32 has an operative electrode plane facing the web material 18 for creating capacitive reactance. The reference plate electrode 32 includes mounting holes 56 permitting mounting of the detection assembly 12 directly to a mounting surface 55 (see FIG. 1) on the labelling line without the necessity of field-mounting and aligning the sensor electrode unit 34 to a backing plate defined by a portion of the line. The reference plate electrode 32 also includes ramps 49 which support the web material 18 in the gap 16. The ramps 49 also provide a means for easily threading the web material 18 in the gap 16. The web material 18 does not have to rest or ride against the reference plate electrode 32, but rather, the web material 18 need only be positioned to pass through the gap 16 in order to create the dielectric constants.

Referring specifically to FIG. 2, the use of shims 57 permits the size of the gap 16 to be easily variable and adjustable by an operator when configuring the detection assembly 12 to optimize the detection assembly 12 to detect the lateral edge of labels 20. The shims 57 are mounted between the sensor housing 30 and the reference plate electrode 32 and are held in place by screws 52. The shims 57 generally vary in size between 0.025 inches and 0.1 inches so that the gap 16 is preferably not more than 0.1 inches. In the present embodiment, the shim 57 is 0.032 inches in thickness.

Sensor Electrode Unit

Referring to FIG. 3, the sensor electrode unit 34 includes a circuit board 59, a pair of active sensing electrode tips 58 and 60, a pair of active guard electrodes 62 and 64. The sensor electrode unit 34 is potted in the second cavity 48 of the sensor housing 30, along with the edge detection circuitry 38 and the appropriate wiring, using an epoxy material 69 in a manner well-known to those skilled in the art. A double side adhesive tape 71 is used to position the sensor electrode unit 34 in the desired location on a probe shelf 72 in the second cavity 48 and to electrically insulate the sensor electrode unit 34 from the metallic sensor housing 30.

The circuit board 59 is preferably made of fiberglass and has a generally rectangular dimension. The circuit board 59 has a length of approximately 1.44 inches, a width of approximately 0.375 inches, and a height of approximately 0.125 inches.

Each of the active sensing tips 58 and 60 is affixed along a bottom surface of the circuit board 59, spaced apart from each other and from the edges of the circuit board 59. It is desirable that the width of each sensing tip 58 and 60 be equal to the width of the spacing between adjacent labels 20 on the web material 18. As the industry standard width between labels is approximately 0.125 inches, the width of each sensing tip 58 and 60 is approximately 0.125 inches. The longer the sensing tip 58 and 60 the larger the signal produced from the capacitance change. Accordingly, the length of each sensing tip 58 and 60 is approximately 1.2 inches, which is substantially longer than the round sensing tips used in the prior art. The distance between the center of each sensing tip 58 and 60 must be at least the distance between labels on the web material 18. However, it is also desirable to maintain the sensing tips 58 and 60 close together so that any movement of the reference plate electrode 32 with respect to the sensing tips 58 and 60 will be parallel movement. Accordingly, the distance between the centers of the sensing tips 58 and 60 is approximately 0.200 inches.

The guard electrodes 62 and 64 are affixed along substantially the entire top surface and side surface of the circuit board 59 and along the bottom surface of the circuit board 59 around the active sensing tips 58 and 60. The guard electrodes 62 and 64 shield the active sensing tips 58 and 60, respectively, from undesired capacitance in all directions except across an operative electrode plane defined by the active sensing tips 58 and 60. The operative electrode plane extends out over and faces a portion of the web 18 carrying the plurality of the labels 20. The operative electrode plane runs parallel to a portion of the lateral edge of the label 20. The active sensing tips 58 and 60 and the guard electrodes 62 and 64 are constructed of copper and a lead-tin plating and are applied to the fiberglass circuit board 59 in a manner well-known to those skilled in the art.

Thus, the arrangement of the active sensing tips 58 and 60 in relation to the reference plate electrode 32 provide two (2) parallel plate capacitors, C1 and C2 (see FIG. 5), in the gap 16 through which the labels pass. The capacitors C1 and C2 provide the desired capacitance for detecting the label edges. In order to provide accurate edge detection, the value of the desired capacitance of the sensing capacitors C1 and C2 should he a function of only one variable, namely the changes in the material thickness. If the value of the sensing capacitors C1 and C2 is a function of other variables then slight changes in these variables will cause instability problems in detecting the label edges.

Referring to FIG. 3, the active sensing tips 58 and 60 are each associated with three different capacitances. The active sensing tip 58 is associated with the capacitance between the active sensing tip 58 and the guard electrode 62 (denoted $C_{G1}$), the capacitance between the active sensing tip 58 and the sensor housing 30 (denoted $C_x$), and the desired capacitance between the active sensing tip 58 and the reference plate electrode 32 (C1). The active sensing tip 60 is associated with the capacitance between the active sensing tip 60 and the guard electrode 62 (denoted $C_{G2}$), the capacitance between the active sensing tip 60 and the sensor housing 30 (denoted $C_y$), and the desired capacitance between the active sensing tip 60 and the reference plate electrode 20 (C2).

The guard electrodes 62 and 64 are positioned between the respective active sensing tips 58 and 60 and the sensor housing 30 to insulate the respective active sensing tips 58 and 60 from the capacitive effects of the sensor housing 30. Thus, the capacitance formed between the active sensing tips 58 and 60 and the sensor housing 30 is approximately zero, so that the effect of $C_x$ and $C_y$ is negligible.

In order to eliminate $C_{G1}$ and $C_{G2}$, the active sensing tips 58 and 60 and the guard electrodes 62 and 64 are both connected to the same electrical potential relative to the reference plate electrode 20. In this arrangement the electrical potential difference between the active sensing tips 58 and 60 and the guard electrodes 62 and 64 is zero, so that the difference in charge between the active sensing tips 58 and 60 and the guard electrodes 62 and 64 is also zero. Accordingly, by providing the active guard electrodes 62 and 64 at the same electrical potential as the active sensing tips 58 and 60, the capacitances $C_{G1}$ and $C_{G2}$ are approximately zero and therefore negligible.

Edge Detection Circuitry

Figure 5:
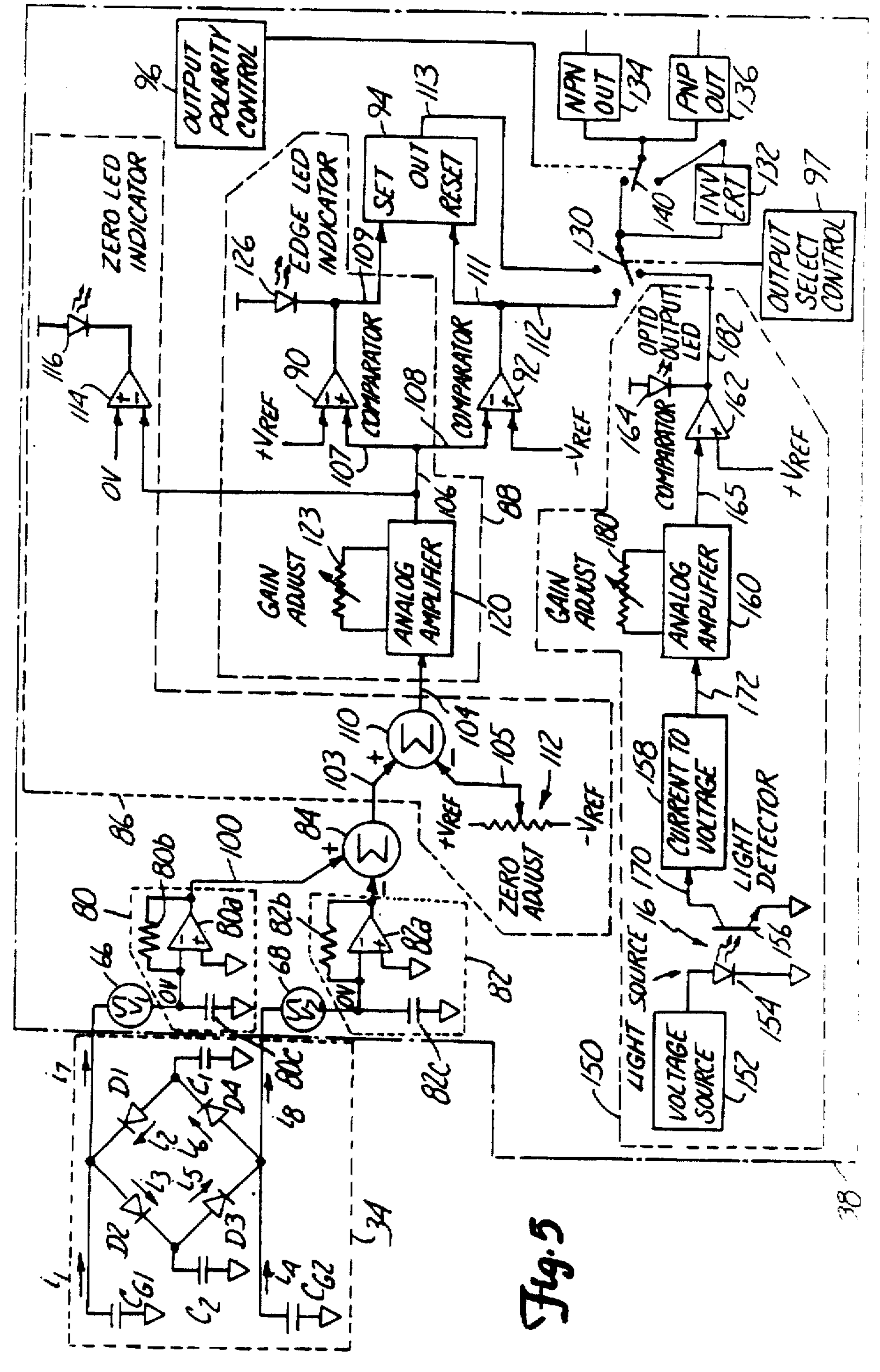
FIG. 5 is a schematic drawing showing the various components of the label registration and detection system of the present invention.

Referring to FIG. 5, the edge detection circuitry 38 measures the capacitance C1 between the active sensing tip 58 and the reference plate electrode 20 and the capacitance C2 between the active sensing tip 60 and the reference plate electrode 20. The edge detection circuitry 38 includes a pair of transimpedance amplifiers in the form of DC current to voltage converters 80 and 82, a voltage summing circuit 84, a zero adjustment control circuit 86, a gain adjustment control circuit 88, a first comparator 90, a second comparator 92, a set/reset (SR) flip flop 94, an output plurality control 96, and an output select control 97.

The current detection circuitry 70 includes AC voltage sources 66 and 68 and diodes D1, D2, D3, and D4 (in the form of a "bridge" circuit) to rectify the current produced by the voltage sources 66 and 68. The cathode of diode D1 is connected to the voltage source 66, to the guard electrode 62 (capacitor $C_{G1}$), and to the anode of diode D2. The cathode of diode D2 is connected to the active tip electrode 60 (capacitor C2) and to the anode of diode D3. The cathode of diode D3 is connected to the voltage source 68, to the guard electrode 64 (capacitor $C_{G2}$), and to the anode of diode D4. The cathode of diode D4 is connected to the active tip electrode 58 (capacitor C1) and to the anode of diode D1. The voltage sources 66 and 68 produce current $i_1$ across capacitor $C_{G1}$, current $i_2$ across diode $D_1$, current $i_3$ across diode D2, current $i_4$ across capacitor $C_{G2}$, current $i_5$ across diode D3, current $i_6$ across diode D4, current $i_7$ across voltage source 66 and current $i_8$ across voltage source 68.

Voltage sources 66 and 68 supply continuous AC voltage signal V1 and V2 respectively, to the diode bridge circuit. More particularly, the voltage sources 66 and 68 both apply an AC signal equal in magnitude, phase, and frequency to the active sensing tips 58 and 60, respectively, so that V1=V2. Preferably, the continuous AC signals output from each voltage sources 66 and 68 (and applied to each active sensing tip 58 and 60) has an amplitude of 70 volts peak-to-peak when the voltage applied to the sensor is 24 VDC and a frequency of 2.2 MHz. Neither of these quantities is regulated because the sensor uses a differential capacitance measurement.

Since $X_c=\frac{1}{2}\pi fC$ and thus $V=\frac{1}{2}\pi fC$, (where "$X_c$" is capacitive reactance, "V" is the voltage of the oscillator 66 or 68, "I" is the current in line 100 or 102, "C" is the capacitance, and "f" is the frequency of the oscillator 66 or 68), an increase in the capacitance C causes a decrease in the capacitive reactance $X_c$ and thus an increase in current I. Similarly, a decrease in capacitance C causes an increase in the capacitive reactance $X_c$ and a decrease in current I. The current $i_7$ across the voltage source 66 and the current $i_8$ across the voltage source 68 are determined using the following formulas:

$$i_7=i_1+i_2-i_3;\text{and} \quad \text{Equation 1}$$

$$i_8=i_4+i_5-i_6. \quad \text{Equation 2}$$

Figure 6:
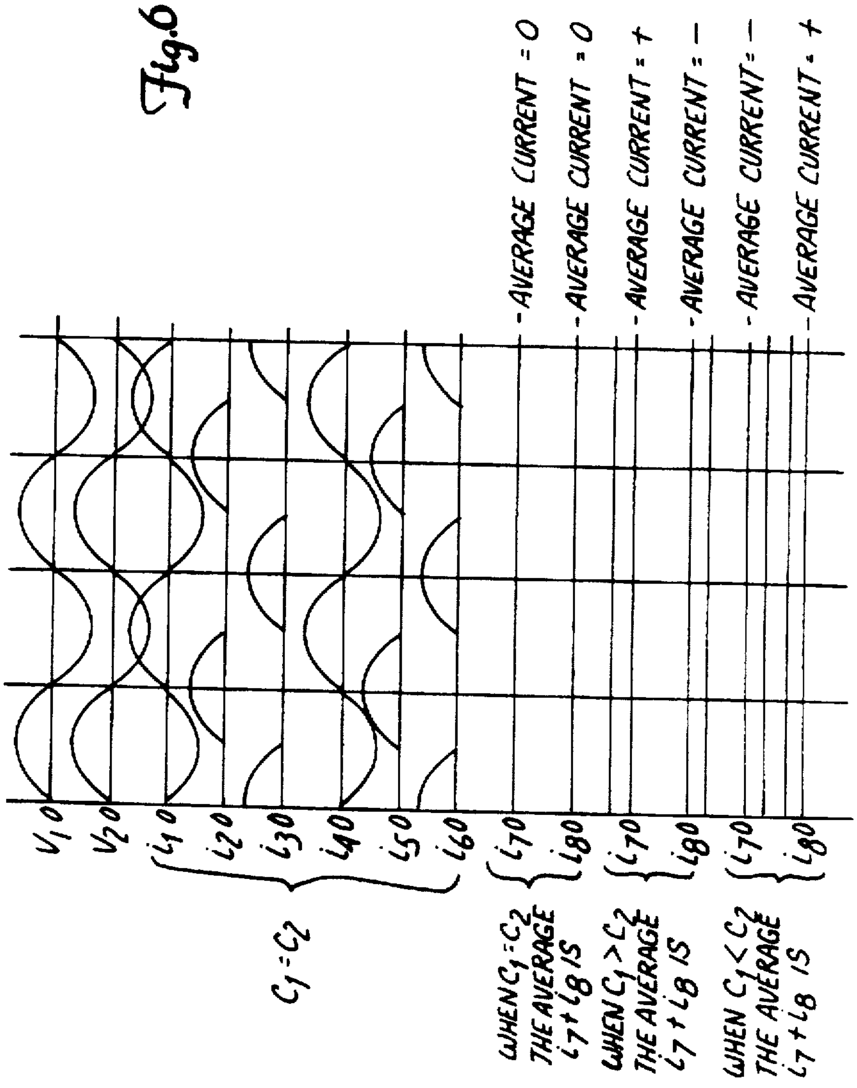
FIG. 6 illustrates a series of graphs showing voltage and current signals along selected paths across selected components in FIG. 5 for the capacitance sensor according to the present invention.

FIG. 6 illustrates the voltage signals V1 and V2 produced by voltage sources 66 and 68 and the corresponding steady state currents $i_1$–$i_6$ when C1=C2. The waveforms illustrated for currents $i_2$, $i_3$, $i_5$ and $i_6$ show that the diodes D1–D4 rectify the current produced by the active sensing tips 58 and 60. The currents $i_1$ and $i_4$, produced by guard capacitors $C_{G1}$ and $C_{G2}$, respectively, are not rectified and are therefore AC currents which therefor provide a 0 amps average DC current. Currents $i_2$ and $i_6$ are equal in magnitude and this magnitude varies in dependance on C1, but are illustrated for the steady state condition where C1=C2. Thus, $i_{C1}=|i_2|=|i_6|$. Currents $i_3$ and $i_5$ are equal in magnitude and this magnitude varies in dependance on changes of C2, but again as mentioned above are illustrated for the steady state condition where C1=C2. Thus, $i_{C2}=|i_3|=|i_5|$. With this understanding the currents $i_7$ and $i_8$ from Equations 1 and 2 may he expressed using the following formulas:

$i_7 i_{C1}-i_{C2}$; and Equation 3

$i_8=i_{C2}-i_{C1}$. Equation 4

FIG. 6 further illustrates the steady state currents $i_7$ and $i_8$ as the dielectric constant of capacitors C1 and C2 changes. More particularly, when C1=C2 the average current for both $i_7$ and $i_8$ is 0 amps. When C1>C2, then $i_{C1}>i_{C2}$ and the average current for $i_7$ is greater than 0 amps and the average current for $i_8$ is less than 0 amps. When C1<C2, then $i_{C1}<i_{C2}$ and the average current for $i_7$ is less than 0 amps, and the average current for $i_8$ is greater than 0 amps.

Referring back to FIG. 5, the DC current to voltage converter 80 converts the current $i_7$ produced by $C_1$ and $C_2$ to an analog voltage output signal along line 100. The analog voltage output signal represents detection of the lateral edges of labels 20 where there is a dielectric transition between the web material 18 only and the web material 18 plus label 20. The DC current to voltage converter 80 includes negative feedback operation amplifier 80*a*, resistor 80*b* and capacitor 80*c*. The capacitor 80*c* provides a short circuit to ground for the AC component of current $i_7$. Capacitor 80*c* is chosen to have a small value, but must be sufficient to attenuate the AC current. The resistor 80*b* is selected to increase the signal level. In this arrangement, the DC component of the current $i_7$ is converted into a DC voltage.

The DC current to voltage converter 82 converts the current $i_8$ produced by differences in $C_1$ and $C_2$ to an analog voltage output signal along line 102. This analog voltage signal represents detection of the lateral edges of labels 20 where there is a dielectric transition between the web material 18 only and the web material 18 plus label 20. The DC current to voltage converter 82 includes negative feedback operation amplifier 82*a*, resistor 82*b* and capacitor 82*c*. The capacitor 82*c* provides a short circuit to ground for the AC component of current is. Capacitor 82*c* is chosen have a small value, but must be sufficient to attenuate the AC current. The resistor 82*b* is selected to increase the signal level. In this arrangement, the DC component of the current $i_8$ is converted into a DC voltage.

Figure 7:
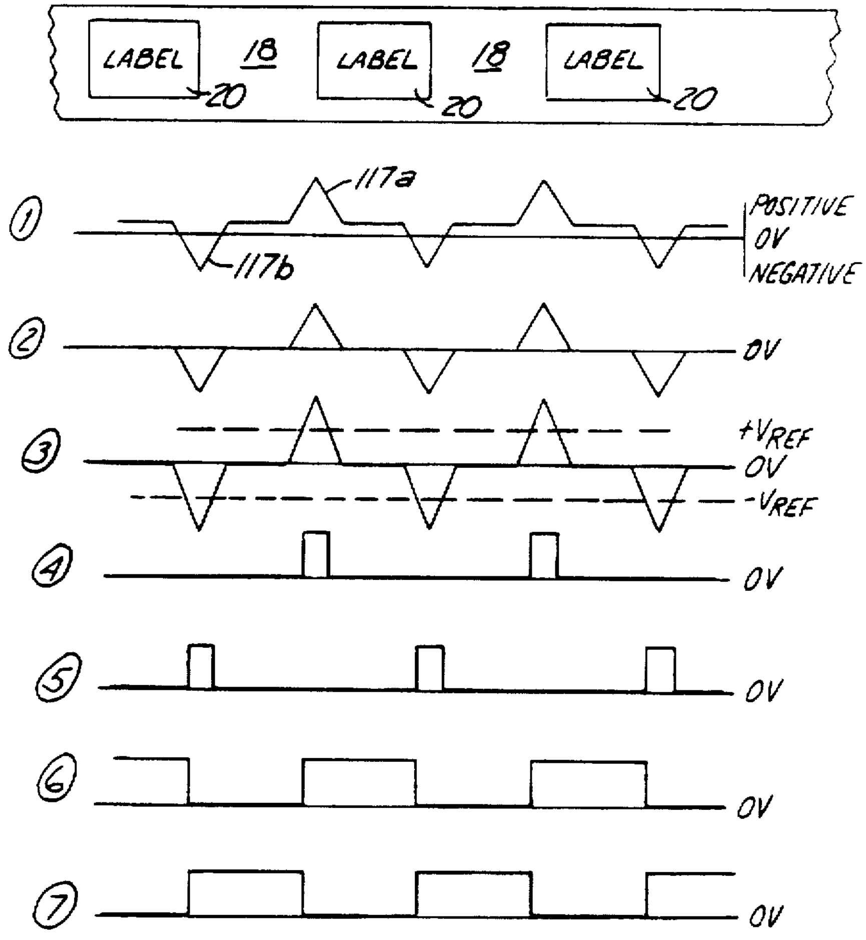
FIG. 7 illustrates a series of graphs showing voltage signals at selected points on schematic of FIG. 5 for the capacitance sensor according to the present invention.

The voltage from the DC current to voltage convertors 82 and 84 is fed into the voltage summing circuit 84 along lines 100 and 102 so that: $i_7-i_8=2(i_{C1}-i_{C2})$ Equation 5. The construction of the voltage summing circuit 84 is well known to one of ordinary skill in the art. Waveform 1 in FIG. 7 illustrates the dynamic voltage signal on an output line 103 of the voltage summing circuit 84 as a series of labels 20 are passed through the gap 16 thereby changing the capacitance values of C1 and C2 over time. When C1=C2 then the voltage out of the voltage summing circuit 84 is zero. When C1>C2 then the voltage out of the voltage summing circuit 84 is negative. When C1<C2 than the voltage out of the voltage summing circuit 84 is positive. Voltage waveform 1 has triangular peaks which indicate the presence of each lateral edge of the label 20. A positive peak 117*a* indicates a trailing edge and a negative peak 117*b* indicates a leading edge. The triangular peaks 117*a* and 117*b* are the result of the changing capacitance C1 and C2, in other words the dynamic change in the steady state currents $i_7$ and $i_8$ shown in FIG. 6.

After assembly of the label detector assembly 12, the values of C1 and C2 are usually not equal due to manufacturing tolerances in the components and the assembly process. This slight difference causes a non-zero value on the output line of the voltage summing circuit 84. This undesirable difference is removed using the zero adjustment control circuit 86. The zero adjustment control circuit 86 includes a voltage summing circuit 110, a potentiometer 112, a comparator 114, and a "ZERO" LED indicator 116. Waveform 2 in FIG. 7 illustrates the centered voltage signal on the output line 104 of the voltage summing circuit 110 after zero adjustment as a series of labels 20 are passed through the gap 16 thereby changing the capacitance values of C1 and C2 over time.

The voltage summing circuit 110 is a well known to one of ordinary skill in the art and has one input connected to line 103 which is the output to the voltage summing circuit 84 and another input connected to an arm 105 of the potentiometer 112. A resistive element of the potentiometer 112 is connected between positive reference voltage $+V_{ref}$ and negative reference voltages $-V_{ref}$. The potentiometer arm 105 is adjusted by the operator using a screw-like member 118 (see FIG. 1) accessible from the top surface of the sensor housing 30. The output of the voltage summing circuit 110 is fed into the gain adjustment control circuit 88 along line 104 and then into one of the inputs of the comparator 114. The other input of comparator 114 is tied to ground (O volts). The output of comparator 114 is connected through the "ZERO" LED indicator 116 to ground. The "zero point" of the analog voltage from the voltage summing circuit 110 is determined by adjusting the potentiometer arm 112 using screw member 118 and by viewing the "ZERO" LED indicator 116. When the analog voltage goes above zero volts the LED indicator 116 turns "on". When the voltage goes below zero volts the LED indicator 116 turns "off". Thus, the potentiometer 112 is adjusted until the "ZERO" LED indicator 116 just turns "on" or "off". While the zero adjustment control circuit 86 includes the external screw member 118 for making the physical adjustment to the system, a slider or other mechanism or an externally provided voltage source may be used for changing the analog voltage output of the voltage summing circuit 110 positive and negative with respect to the reference threshold.

After passing the zero adjustment control circuit 86, the centered analog voltage output (waveform 2 in FIG. 7) is fed into the gain adjustment control circuit 88 which assures that the analog voltage output swings above and below a fixed reference threshold voltage $+V_{ref}$ and $-V_{ref}$ in order to assure that the amplitude of the signal is sufficient to detect the label edge. Waveform 3 in FIG. 7 illustrates the analog voltage signal on the output line 106 of the analog amplifier after gain adjustment as a series of labels 20 are passed through the gap 16 thereby changing the capacitance values of C1 and C2 over time. The gain adjustment control circuit 88 includes an analog amplifier 120, a screw 122 (see FIG. 1) on the exterior of the sensor housing 30, the comparator 90 and an "EDGE" LED indicator 126. The screw 122 changes a valve of a resistor 123 value to alter the gain of the analog amplifier 120. When the analog input signal is greater than the $+V_{ref}$ threshold the edge LED indicator 126 is activated.

The level of the gain of the analog amplifier 120 is adjusted during an initial "setup" operation before the unit is put in a working environment. The setup operation maximizes the sensitivity of the detection assembly by ensuring that the centered output signal has an amplitude greater than the reference threshold and provides a buffer on both sides of the reference thresholds $+V_{ref}$ and $-V_{ref}$.

The setup operation for gain adjustment of the analog output signal involves stepping the web material through the gap 16, and adjusting the gain adjustment screw 122 in a counterclockwise direction until the "EDGE" LED indicator 126 no longer lights, adjusting the gain adjustment screw 122 in a clockwise direction until the "EDGE" LED indicator 126 just starts to light, and then adjusting the gain adjustment screw 122 another ¾ of a turn clockwise to assure that the amplitude of the analog signal exceeds the reference thresholds. Since every web and label and different rolls of the same label is subject to a slightly different sensitivity because of inherent changes in thickness, thereby causing a different capacitance, providing the buffer amplitude assures maximum reliability in sensing the label edge.

After passing the zero adjustment control 86 and the gain adjustment control 88, the centered and amplified analog voltage output (waveform 3 in FIG. 7) is fed in parallel to the first fixed voltage comparator 90 along line 107 which triggers a trailing edge digital registration output signal (see waveform 4 in FIG. 7) and to the second fixed voltage comparator 92 along line 108 which triggers a leading edge digital output signal (see waveform 5 in FIG. 7), and (as described above) to the comparator 114 for activating the zero LED indicator. More particularly, the amplified analog voltage output is fed to the positive input of comparator 90, the negative input being connected to $+V_{ref}$. The amplified analog voltage output is fed in parallel to the negative input of comparator 92, the positive input being connected to $-V_{ref}$. The output of comparator 90 is connected to the set pin of SR flip flop 94 by line 109. The output of comparator 92 is connected to the reset pin of the SR flip flop 94 by line 111 and also directly to the output select control 97 by line 112.

The SR flip flop 94 converts the waveforms 4 and 5 into waveform 6 in FIG. 6 which directly relates to the shape of the label 20. The output of the SR flip flop 94 is connected to the output select control 97 along line 113. The output select control 97 activates a switch 130 to control propagation of the desired output as indicated by the user. In position A, the user output is the output of the SR flip flop 94 along line 113 (waveform 6 in FIG. 7). In position B, the user output is the output of comparator 92 along line 112 (waveform 5 in FIG. 6). In position 3, the user output is the output of the optical label detection circuit 150.

Since the label registration machinery responds to either the leading edge or the trailing edge of the label, a signal invertor 132 is provided for inverting waveform 6 in FIG. 7. The inverted waveform is shown as waveform 7 in FIG. 7. The output plurality control 96 is connected to a switch 140 for activating the signal invertor 132.

Finally, the output signal is transmitted to the label registration control through the use of an NPN 134 type transition or PNP type transistor 136 with open collector as is well known to those skilled in the art for use in registering labels 20 with containers 24 to which the labels 20 are being affixed. The transistors 134 and 136 pulls the digital registration output signal up to a desired voltage to meet user needs for label registration. For maximum registration accuracy, a negative edge of the digital output registration signal should be used with the NPN transistor 134 and a positive edge with the PNP transistor 136.

Optical Sensor Unit

The present invention provides the combination of the optical sensor unit 150 with the capacitance sensor unit 13 which was described above. The components and structure of the optical sensor unit 150 are well known to those skilled in the art. Referring back to FIG. 5 the optical sensor unit 150 includes a voltage source 152, a light source 154, a light detector 156, a current voltage converter 158, an analog amplifier 160, a comparator 162, and an optical output LED 164.

The voltage source 152 is connected to the light source 154 which is typically an LED. The light source 154 directs a beam of light onto the label 20 and web material 18. In this arrangement the label 20 must be made of a material which is opaque or which has only one area that is opaque in order to reflect the light from the light source. The web 18 must be made of a material which a translucent to pass the light from the light source to the light detector 156. The web 18 carrying the labels 20 is placed in the gap 16 between the sensor housing 30 and the reference plate electrode 32. In this arrangement, the light source 154 is positioned in the sensor housing 30 and the light detector 156 is positioned in the reference plate electrode 32. The labels 20 block 100% of the light emitted from the light source 154 which produces no current out of the light detector 156. Gaps of labels 20 or web 18 permit some of the light to pass to the light detector 156 which produces a current in line 170. Preferably, the light source 154 and the light detector 156 are both positioned along a center line of the sensor housing 30 in alignment with the active sensing tips 58 and 60 in order to provide a synchronized detection signal corresponding to the label position as output from the capacitance sensor unit 13. The current to voltage converter 158 converts the current in line 170 into a voltage waveform on line 172. The voltage on line 172 is illustrated in waveform I in FIG. 8 as a series of labels 20 are passed through the gap 16 thereby changing the optical transmission of the light between the light source 154 and the light detector 156.

Figure 8:
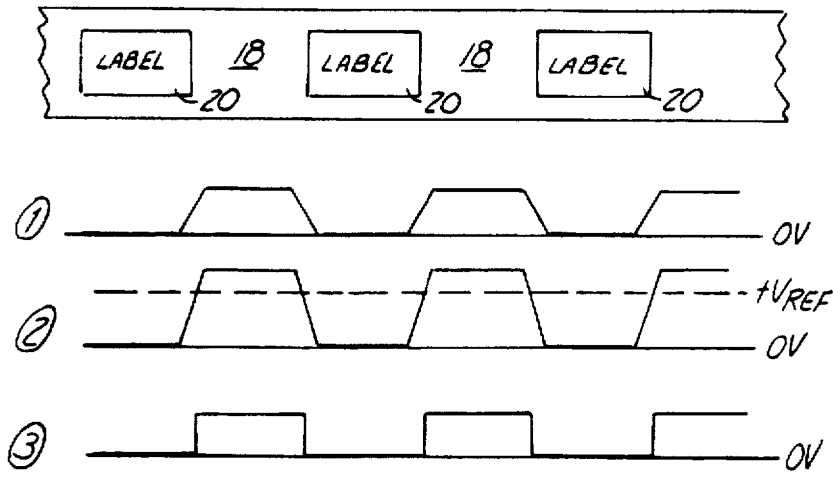
FIG. 8 illustrates a series of graphs showing voltage signals at selected points on schematic of FIG. 5 for the optical sensor according to the present invention.

The analog waveform I in FIG. 8 is then amplified and its magnitude adjusted using a gain adjustment 180 of the analog amplifier 160 until the analog signal increases above $+V_{ref}$ in a manner similar to the gain adjustment 123 in the capacitance sensor unit 13. The output of the analog amplifier 160 along line 165 is illustrated by waveform 2 in FIG. 8. The output of the analog amplifier 160 is connected to the negative terminal of comparator 162 while the positive terminal is connected to $+V_{ref}$. The optical output LED 164 is used to determine the proper gain adjustment just as the "EDGE" LED indicator 126 as was used in the capacitance sensor unit 13. Output from the comparator 162 is fed to the output select control 97 along line 182 for use as the final output of the sensor. The output voltage waveform on line 182 is illustrated by waveform 3 in FIG. 8. The output voltage waveform may be inverted using the output polarity control 96 as described above.

Although the present invention has been described with reference to preferred embodiments, workers skilled in the art will recognize that changes may be made in form and detail without departing from the spirit and scope of the invention.

What is claimed is:

1. A circuit for selectively charging and discharging a differential capacitive sensor having first and second capacitive sensors, the first capacitive sensor having a first sensor electrode and a first reference electrode and the second capacitive sensor having a second sensor electrode and a second reference electrode, the second reference electrode being connected to the first reference electrode, the circuit comprising:

a first diode having a cathode for connection to a first time-varying voltage source and an anode connected to the first sensor electrode;

a second diode having an anode for connection to the first time-varying voltage source and a cathode connected to the second sensor electrode;

a third diode having a cathode for connection to a second time-varying voltage source having the same amplitude and phase the first time-varying voltage source and an anode connected to the second sensor electrode; and a fourth diode having an anode for connection to the second time-varying voltage source and a cathode connected to the first sensor electrode.

2. The circuit of claim 1, wherein the differential capacitive sensor includes first and second capacitive guards, the first guard having a first guard electrode for connection to the first time-varying voltage source and having a third reference electrode connected to the first and second reference electrodes, and the second guard having a second guard electrode for connection to the second time-varying voltage source and a fourth reference electrode connected to the first, second and third reference electrodes.

3. The circuit of claim 2, wherein the first, second, third and fourth reference electrodes form a single reference plate electrode.

4. The circuit of claim 1, further comprising means for measuring currents into the first and second time-varying voltage sources to determine a difference between the capacitances of the first and second capacitive sensors, the current into the first time-varying voltage source having a polarity and amplitude based on a difference between a current through the first diode and a current through the second diode, and the current into the second time-varying voltage source having a polarity and amplitude based on a difference between a current through the third diode and a current through the fourth diode.

5. The circuit of claim 4, wherein:

the current into the first time-varying voltage source is positive and the current into the second time-varying voltage source is negative and has the same amplitude as the current into the first time-varying voltage source when the capacitance of the first sensor is greater than the capacitance of the second sensor;

the current into the first time-varying voltage source is negative and the current into the second time-varying voltage source is positive and has the same amplitude as the current into the first time-varying voltage source when the capacitance of the first sensor is less than the capacitance of the second sensor; and the current into the first time-varying voltage source and the current into the second time-varying voltage source are both zero when the capacitance of the first sensor and the capacitance of the second sensor are equal.

6. The circuit of claim 4, wherein the means for measuring the current into the first and second time-varying voltage sources comprises:

a first amplifier having an inverting input, a non-inverting input, and an output, the inverting input being electrically connected to the first time-varying voltage source and the non-inverting input being connected to electrical ground;

a second amplifier having an inverting input, a non-inverting input, and an output, the inverting input being electrically connected to the second time-varying voltage source and the non-inverting input being connected to electrical ground; and a voltage summing circuit having a first input connected to the output of the first amplifier and a second input connected to the output of the second amplifier, and having an output for outputting a difference between a first voltage at the output of the first amplifier and a second voltage at the output of the second amplifier.

7. The circuit of claim 6, wherein the first and second amplifiers are current-to-voltage converting amplifiers.

8. The circuit of claim 6, including:

a first resistor connected between the inverting input and the output of the first amplifier and a first capacitor connected between the inverting input of the first amplifier and electrical ground; and a second resistor connected between the inverting input and the output of the second amplifier and a second capacitor connected between the inverting input of the second amplifier and electrical ground.

9. A circuit for selectively charging and discharging a differential capacitive sensor having first and second capacitive sensors, the first capacitive sensor having a first sensor electrode and a first reference electrode and the second capacitive sensor having a second sensor electrode and a second reference electrode, the second reference electrode being connected to the first reference electrode, the circuit comprising:

first means for providing a path from a first time-varying voltage source to charge the second capacitive sensor and for blocking a path to discharge the second capacitive sensor through the first time-varying voltage source;

second means for providing a path from a second time-varying voltage source having the same amplitude and phase as the first time-varying voltage source to charge the first capacitive sensor and for blocking a path to discharge the first capacitive sensor through the second time-varying voltage source;

third means for providing a path to discharge the first capacitive sensor through the first time-varying voltage source and for blocking a path from the first time-varying voltage source to charge the first capacitive sensor; and fourth means for providing a path to discharge the second capacitive sensor through the second time-varying voltage source and for blocking a path from the second time-varying voltage source to charge the second capacitive sensor.

10. The circuit of claim 9, wherein the differential capacitive sensor includes first and second capacitive guards for shielding the first and second sensor electrodes in substantially all directions except toward the first and second reference electrodes, respectively.

11. The circuit of claim 10, wherein the first guard has a first guard electrode for connection to the first time-varying voltage source and a third reference electrode connected to the first and second reference electrodes, and the second guard has a second guard electrode for connection to the second time-varying voltage source and a fourth reference electrode connected to the first, second and third reference electrodes.

12. The circuit of claim 11, wherein the first, second, third and fourth reference electrodes form a single reference plate electrode.

13. The circuit of claim 9, further comprising means for measuring currents into the first and second time-varying voltage sources to determine a difference between the capacitances of the first and second capacitive sensor, the current into the first time-varying voltage source having a polarity and amplitude based on a difference between a current through the third means and a current through the first means, and the current into the second time-varying voltage source having a polarity and amplitude based on a difference between a current through the fourth means and a current through the second means.

14. The circuit of claim 13, wherein:

the current into the first time-varying voltage source is positive and the current into the second time-varying voltage source is negative and has the same amplitude as the current into the first time-varying voltage source when the capacitance of the first sensor is greater than the capacitance of the second sensor;

the current into the first time-varying voltage source is negative and the current into the second time-varying voltage source is positive and has the same amplitude as the current into the first time-varying source when the capacitance of the first sensor is less than the capacitance of the second sensor; and the current into the first time-varying voltage source and the current into the second time-varying voltage source are both zero when the capacitance of the first sensor and the capacitance of the second sensor are equal.

15. The circuit of claim 13, wherein the means for measuring the current into the first and second time-varying voltage sources comprises:

a first amplifier having an inverting input, a non-inverting input, and an output, the inverting input being electrically connected to the first time-varying voltage source and the non-inverting input being connected to electrical ground;

a second amplifier having an inverting input, a non-inverting input, and an output, the inverting input being electrically connected to the second time-varying voltage source and the non-inverting input being connected to electrical ground; and a voltage summing circuit having a first input connected to the output of the first amplifier and a second input connected to the output of the second amplifier, and having an output for outputting a difference between a first voltage at the output of the first amplifier and a second voltage at the output of the second amplifier.

16. The circuit of claim 15, wherein the first and second amplifiers are current-to-voltage converting amplifiers.

17. The circuit of claim 15, including:

a first resistor connected between the inverting input and the output of the first amplifier and a first capacitor connected between the inverting input of the first amplifier and electrical ground; and a second resistor connected between the inverting input and the output of the second amplifier and a second capacitor connected between the inverting input of the second amplifier and electrical ground.

18. A method of determining a difference between capacitances associated with first and second capacitive sensors, the method comprising:

charging the second capacitive sensor with a first charging current from a first time-varying voltage source and charging the first capacitive sensor with a second charging current from a second time-varying voltage source having the same amplitude as the first time-varying voltage source while blocking discharge of the second capacitive sensor through the first time-varying voltage source and blocking discharge of the first capacitive sensor through the second time-varying voltage source;

subsequently discharging the first capacitive sensor with a first discharge current into the first time-varying voltage source and discharging the second capacitive sensor with a second discharge current into the second time-varying voltage source while blocking charging of the first capacitive sensor from the first time-varying voltage source and blocking charging of the second capacitive sensor from the second time-varying voltage source; and measuring currents into the first and second time-varying voltage sources to determine the difference between the capacitances associated with the first and second capacitive sensors, the current into the first time-varying voltage source having a polarity and amplitude based on a difference between the first discharge current and the first charging current, and the current into the second time-varying voltage source having a polarity and amplitude based on a difference between the second discharge current and the second charging current.

19. The method of claim 18, wherein:

the current into the first time-varying voltage source is positive and the current into the second time-varying voltage source is negative when the capacitance associated with the first sensor is greater than the capacitance associated with the second sensor;

the current into the first time-varying voltage source is negative and the current into the second time-varying voltage source is positive when the capacitance associated with the first sensor is less than the capacitance associated with the second sensor; and the current into the first time-varying voltage source and the current into the second time-varying voltage source are equal when the capacitance associated with the first sensor and the capacitance associated with the second sensor are equal.

* * * * *

UNITED STATES PATENT AND TRADEMARK OFFICE

CERTIFICATE OF CORRECTION

PATENT NO. : 5,793,217

DATED : AUGUST 11, 1998

INVENTOR(S) : RAYMOND W. HERBST, JR.

It is certified that error appears in the above-identified patent and that said Letters Patent is hereby corrected as shown below:

Col. 7, Line 14, delete "he", insert --be--

Col. 7, Line 17, delete "$i_7 i_{c1} - i_{c2}$", insert --$i_7 = i_{c1} - i_{c2}$--

Col. 7, Line 52, delete "current is.", insert --current $i_8$.--

Col. 10, Line 49, delete "waveform I", insert --waveform 1--

Col. 10, Line 54, delete "waveform I", insert --waveform 1--

Signed and Sealed this

Fourteenth Day of September, 1999

*Attest:*

Q. TODD DICKINSON

*Attesting Officer* *Acting Commissioner of Patents and Trademarks*